(12) United States Patent
Bai

(10) Patent No.: US 6,459,163 B1
(45) Date of Patent: Oct. 1, 2002

(54) SEMICONDUCTOR DEVICE AND METHOD FOR FABRICATING THE SAME

(75) Inventor: Jin-Chuan Bai, Taipei (TW)

(73) Assignee: United Test Center, Inc., Hsin-Chu (TW)

( * ) Notice: Subject to any disclaimer, the term of this patent is extended or adjusted under 35 U.S.C. 154(b) by 0 days.

(21) Appl. No.: 09/974,871

(22) Filed: Oct. 12, 2001

(30) Foreign Application Priority Data

Mar. 21, 2001 (TW) ........................ 90106565 A

(51) Int. Cl.⁷ .................. H01L 23/28; H01L 23/52
(52) U.S. Cl. ............... 257/787; 257/706; 257/693; 257/784
(58) Field of Search ................ 257/787, 706, 257/666, 693, 737, 784, 773; 438/112, 124, 127

(56) References Cited

U.S. PATENT DOCUMENTS

| | | | | |
|---|---|---|---|---|
| 5,293,072 A | * | 3/1994 | Tsuji et al. ............... 257/737 |
| 5,844,168 A | * | 12/1998 | Schueller et al. .......... 174/52.4 |
| 5,894,108 A | * | 4/1999 | Mostafazadeh et al. ..... 174/52.4 |
| 5,945,741 A | * | 8/1999 | Ohsawa et al. ............. 257/777 |
| 6,060,778 A | * | 5/2000 | Jeong et al. ............... 257/710 |
| 6,078,097 A | * | 6/2000 | Ohsawa ..................... 257/666 |
| 6,320,267 B1 | * | 11/2001 | Yukawa ...................... 257/783 |
| 6,194,250 B1 | * | 2/2002 | Melton et al. ............. 438/126 |
| 6,373,131 B1 | * | 4/2002 | Karnezoz ................... 257/712 |
| 6,249,046 B1 | * | 6/2002 | Hashimoto .................. 257/691 |

* cited by examiner

Primary Examiner—Jasmine J B Clark
(74) Attorney, Agent, or Firm—Rothwell, Figg, Ernst & Manbeck

(57) ABSTRACT

A semiconductor device is proposed, in which a chip is placed in an opening penetratingly formed in a substrate in a manner as not to come into contact with the substrate, and an encapsulant formed on the substrate fills up the opening for encapsulating the chip. This arrangement of the chip accommodated in the substrate therefore reduces the overall height of the semiconductor device. Moreover, a plurality of conductive elements disposed on the substrate are also encapsulated by the encapsulant in a manner that, bottom sides of the conductive elements are exposed to outside of the encapsulant, and coplanarly positioned with a bottom side of the encapsulant. This therefore provides good planarity for a bottom side of the semiconductor device, allowing the semiconductor device to be well electrically connected to external devices. A method for fabricating the foregoing semiconductor device is also proposed.

10 Claims, 3 Drawing Sheets

SEMICONDUCTOR DEVICE AND METHOD FOR FABRICATING THE SAME

FIELD OF THE INVENTION

The present invention relates to semiconductor devices and methods for fabricating the same, and more particularly, to a semiconductor device in which a chip is disposed on a substrate and electrically connected to external devices via array-arranged conductive elements, and a method for fabricating the semiconductor device.

BACKGROUND OF THE INVENTION

A BGA (ball grid arrayed) semiconductor device provides a semiconductor chip disposed therein with sufficient I/O connections in response to highly performing semiconductor devices desired for use with electronic products. However, such a conventional BGA semiconductor device has the following drawbacks.

First, the conventional BGA semiconductor device has its overall height to be the sum of heights including a portion of an encapsulant higher than the chip, the chip, a substrate mounted with the chip, and solder balls implanted on a bottom surface of the substrate. In other words, such a structure makes the BGA semiconductor device hard to be miniaturized in profile, unless the foregoing components of the BGA semiconductor device are individually reduced in dimension. This therefore restricts the application of the BGA semiconductor device for use in a low-profile product.

Second, in the BGA semiconductor device, the chip is bonded to the substrate by means of an adhesive. Due to a great difference in coefficient of thermal expansion between the chip and the substrate, during a temperature cycle in subsequent fabricating processes or practical operation, thermal stress is generated and leads to delamination occurring at a bonding interface between the chip and the substrate. This greatly affects quality and reliability of fabricated products.

Moreover, after mounting the chip on the substrate via the adhesive such as silver paste, in order to stabilize the adhesive for firmly bonding the semiconductor to the substrate, an additional curing process is often performed for the adhesive. This not only increases the fabrication cost, but makes the fabrication time not able to be further reduced.

Further, for the solder balls implanted in the BGA semiconductor device, due to dimensional inaccuracy of the solder balls, or the occurrence of warpage in the substrate resulted from the thermal stress, the solder balls implanted on the substrate can not be positioned in satisfactory coplanarity. This therefore detrimentally affects electrical connection established between the solder balls and the external devices such as a printed circuit board by using surface mounted technology (SMT).

SUMMARY OF THE INVENTION

A primary objective of the present invention is to provide a semiconductor device and a method for fabricating the same, in which the semiconductor device can be significantly miniaturized in profile.

Another objective of the present invention is to provide a semiconductor device and a method for fabricating the same, in which thermal stress and delamination can be effectively prevented from occurrence, so as to improve quality and reliability of the semiconductor device.

A further objective of the present invention is to provide a semiconductor device and a method for fabricating the same, in which fabrication processes are simplified, and the fabrication cost is reduced.

A further objective of the present invention is to provide a semiconductor device and a method for fabricating the same, in which electrical connection of the semiconductor device to external devices can be improved.

In accordance with the foregoing and other objectives, the present invention proposes a semiconductor device and a method for fabricating the same. The semiconductor device of the invention comprises: a substrate formed with an opening, and disposed with a plurality of conductive traces on a side thereof, a chip having an active side and an opposing inactive side, and accommodated in the opening of the substrate, wherein the chip is dimensionally smaller in surface area than the opening; a plurality of first conductive elements for connecting the active side of the chip to the conductive traces on the substrate, so as to establish electrical connection between the chip and the substrate; a plurality of array-arranged second conductive elements disposed on the substrate, and electrically connected to the conductive traces on the substrate; and an encapsulant formed on the substrate for encapsulating the chip, the first conductive elements, the second conductive elements and the conductive traces, in a manner that the inactive side of the chip is coplanarly positioned with a side of the substrate with no conductive trace disposed thereon, and bottom sides of the second conductive elements are exposed to outside of the encapsulant and coplanarly positioned with a bottom side of the encapsulant.

The method for fabricating a semiconductor device of the invention comprises the steps of: providing a substrate formed with an opening, and disposed with a plurality of conductive traces on a side thereof; providing a chip having an active side and an opposing inactive side, and accommodating the chip in the opening of the substrate, wherein the chip is dimensionally smaller in surface area than the opening; forming a plurality of first conductive elements for connecting the active side of the chip to the conductive traces on the substrate, so as to establish electrical connection between the chip and the substrate; disposing a plurality of array-arranged second conductive elements on the substrate, wherein the second conductive elements are electrically connected to the conductive traces on the substrate; and forming an encapsulant on the substrate for encapsulating the chip, the first conductive elements, the second conductive elements and the conductive traces, in a manner that the inactive side of the chip is coplanarly positioned with a side of the substrate with no conductive trace disposed thereon, and bottom sides of the second conductive elements are exposed to outside of the encapsulant and coplanarly positioned with a bottom side of the encapsulant.

In a preferred embodiment of the invention, the encapsulant is formed to fill up the opening of the substrate, and the inactive side of the chip is exposed to the outside of the encapsulant, in a manner that a coplane is formed among the inactive side of the chip, a side of the encapsulant exposed to outside of the opening, and the side of the substrate disposed with the conductive traces thereon.

In another preferred embodiment of the invention, the encapsulant covers the side of the substrate with no conductive trace disposed thereon and the inactive side of the chip, thereby allowing the substrate and the chip to be interposed between the portion of the encapsulant formed on the side of the substrate having the conductive traces and the portion of the encapsulant formed on the side with no conductive trace. This therefore significantly reduces thermal stress acting between the substrate and the encapsulant, so as to effectively prevent warpage of the substrate from occurrence.

In a further preferred embodiment of the invention, a tape is adhered on the side of the substrate with no conductive trace for covering the opening, and for attaching the inactive side of the chip to the tape. Moreover, an additional encapsulant is formed on the side of the substrate with no conductive trace and the tape, corresponding to the foregoing encapsulant for encapsulating the chip, the first conductive elements, the second conductive elements and the conductive traces. This therefore makes the substrate interposed between the encapsulants.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

First Preferred Embodiment

Figure 1:
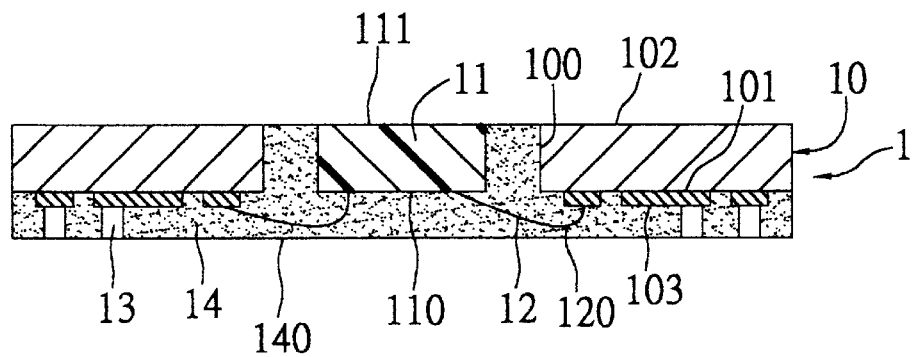
FIG. 1 is a sectional view of a semiconductor device of a first preferred embodiment of the invention.

As shown in FIG. 1, a semiconductor device 1 of a first embodiment of the invention includes a substrate 10; a chip 11 accommodated in an opening 100 formed in the substrate 10; a plurality of gold wires 12 for electrically connecting the chip 11 to the substrate 10; a plurality of array-arranged conductive bumps 13 disposed on the substrate 10, and electrically connected to the substrate 10; and an encapsulant 14 for encapsulating the chip 11, the gold wires 12 and the conductive bumps 13.

The substrate 10 has a first side 101 and a second side 102, wherein the opening 100 is formed to penetrate from the first side 101 to the second side 102, and a plurality of conductive traces 103 are disposed on the first side 101.

The chip 11 is dimensionally smaller in cross-sectional area than the opening 100, so that the chip 11 is accommodated in the opening 100 in a manner as not to come into contact with the substrate 10. The chip 11 can have a thickness smaller than, equal to or larger than that of the substrate 10; however, the chip 11 is preferably not to be thicker than the substrate 10, so as to keep the semiconductor device 1 low in overall height. Moreover, the chip 11 has an active side 110 and an opposing inactive side 111, wherein the active side 110 faces the same as the first side 101 of the substrate 10 when the chip 11 is positioned within the opening 100. This allows the gold wires 12 to connect the active side 110 of the chip 11 to the conductive traces 103 of the substrate 10, so as to establish the electrical connection between the chip 11 and the substrate 10.

The conductive traces 103 on the substrate 10 have terminal ends thereof electrically connected to the conductive bumps 13, thereby allowing the chip 11 to be electrically connected to external devices such as a printed circuit board via the conductive bumps 13. The conductive bumps 13 can be mounted on the substrate 10 by using a conventional printing or plating means in a manner that, bottom sides 130 of the conductive bumps 13 are precisely positioned to be slightly higher than tops 120 of wire loops of the gold wires 12. This makes the gold wires 12 not exposed to outside of the encapsulant 14 after completely forming the encapsulant 14 on the substrate 10. In addition, the printing or plating means employed for mounting the conductive bumps 13 is more cost-effective to implement than using a ball implantation machine to implant solder balls on the substrate 10.

The encapsulant 14 can be formed on the substrate 10 by heating and melting, a material such as epoxy resin. Besides encapsulating the chip 11, the gold wires 12, the conductive traces 103 and the conductive bumps 13, the encapsulant 14 can completely fill up the opening 100 of the substrate 10, wherein the inactive side 111 of the chip 11 is exposed to outside of a top side 141 of the encapsulant 14 in the opening 100 in a manner that, the inactive side 111, the top side 141 and the second side 102 of the substrate 10 are coplanarly positioned. Therefore, as the inactive side 111 of the chip 11 is in direct contact with the atmosphere, heat generated by the chip 11 can be dissipated through the inactive side 11 to the atmosphere, and thus heat dissipating efficiency of the semiconductor device 1 can be improved.

The encapsulant 14 is formed on the first side 101 of the substrate 10 in a manner that, the bottom sides 130 of the conductive bumps 13 are exposed to outside of a bottom side 140 of the encapsulant 14, and coplanarly positioned with the bottom side 140. This coplane therefore allows the semiconductor device 1 to be well electrically connected to the external devices such as the printed circuit board, wherein the conductive bumps 13 can be effectively connected to corresponding connecting pads on the external devices, and thus processibility of the semiconductor device 1 is improved. Moreover, the encapsulant 14 completely encapsulates the first side 101 of the substrate 10, and hermetically encloses the conductive traces 103. As such, there is no need to form a solder mask layer on the first side 101 for covering the conductive traces 103, ad thus the fabrication cost and thickness of the substrate 10 can be reduced.

Therefore, as described above, the semiconductor device 1 of the invention having the chip 11 accommodated in the opening 100 of the substrate 10 makes the overall height thereof smaller than that of a conventional semiconductor device. This is therefore preferable in response to profile miniaturization demand. Further, in the provision of a bottom side good in planarity, the semiconductor device 1 is capable of forming effective electrical connection to the external devices, and thus has better processibility than the conventional semiconductor device.

Figure 2A:
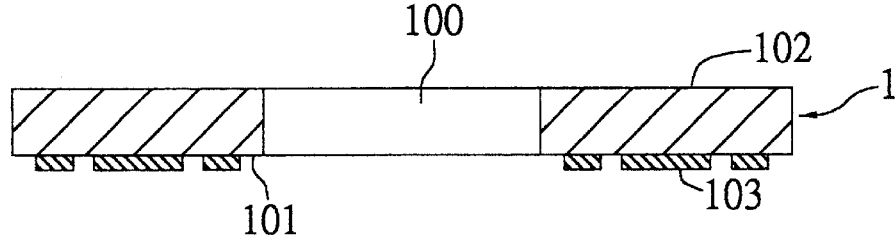
FIGS. 2A–2G are schematic diagrams depicting a method for fabricating a semiconductor device of FIG. 1.

A method for fabricating the foregoing semiconductor device 1 of the first embodiment of the invention is depicted with reference to FIGS. 2A–2G. Referring first to FIG. 2A, a substrate 10 having a first side 101 and an opposing second side 102 is provided, wherein a rectangular opening 100 is formed in the substrate 10, and a plurality of conductive traces 103 are disposed on the first side 101.

Figure 2B:
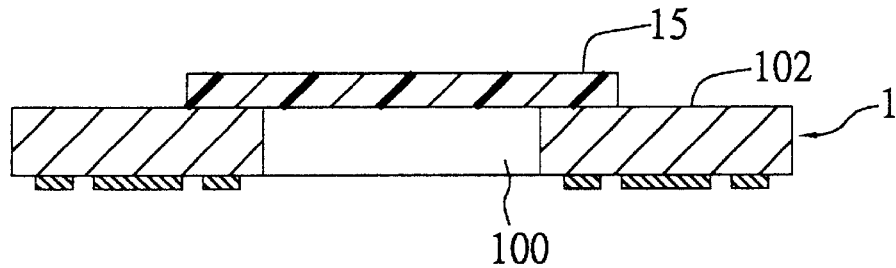

Referring to FIG. 2B, an appropriate sized polyimide tape 15 is adhered to the second side 102 of the substrate 10 for covering the opening 100 of the substrate 10. Therefore, the tape needs to be dimensionally larger than the opening 100.

Figure 2C:
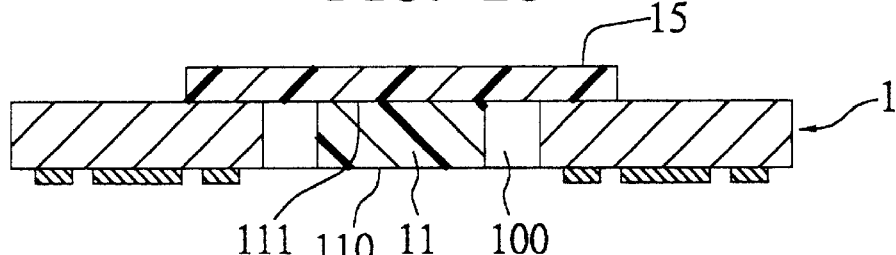

Referring to FIG. 2C, a chip 11 having an active side 110 and an opposing inactive side 111 is placed in the opening 100 of the substrate 10, and the inactive side 111 of the chip 11 is attached to the tape 15 via an adhesive. Thereby, the chip 11 is adhered to the tape 15 with the active side 110 of the chip 11 facing downwardly, and accommodated in the opening 100 without coming into contact with the substrate 10.

Figure 2D:
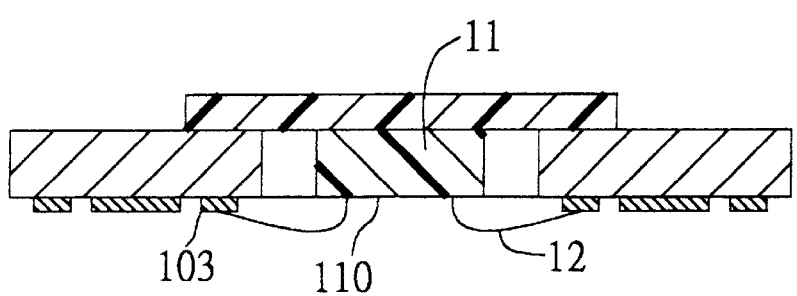

Referring to FIG. 2D, a plurality of gold wires 12 are used to electrically connect the active side 110 of the chip 11 to the corresponding conductive traces 103 on the substrate 10, so as to establish electrical connection between the chip 11 and the substrate 10. Beside the gold wires 12, conventional tape automated bonding (TAB) technology can also be employed for electrically connecting the chip 11 to the substrate 10.

Figure 2E:
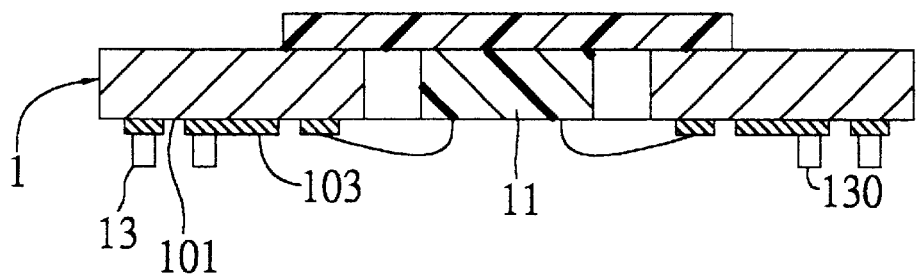

Referring to FIG. 2E, terminals (not shown) of the conductive traces 103 are disposed with corresponding conductive bumps 13 thereon by using a conventional printing or plating means, so as to allow the chip 11 to be electrically connected to external devices such as a printed circuit board via the conductive bumps 13, which are made of a conductive material such as copper, aluminium, copper alloy, aluminium alloy or tin/lead alloy. Since the conventional printing or plating means is employed for disposing the conductive bumps 13 on the substrate 10, it can thus more accurately control the conductive bumps 13 to be higher than tops 120 of wire loops formed by the gold wires 12. Moreover, bottom sides 130 of the conductive bumps 13 are coplanarly positioned.

Figure 2F:
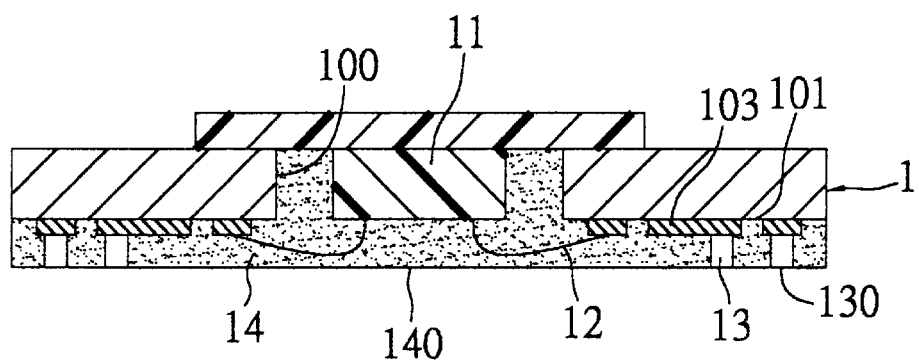

Referring to FIG. 2F, after mounting the conductive bumps 13 on the substrate 10, an encapsulant 14 is formed on the first side 101 of the substrate 10, in a manner as to completely fill up the opening 100 and hermetically encapsulate the chip 11, the gold wires 12 and the conductive traces 103. Moreover, the conductive bumps 13 are also encapsulated by the encapsulant 14 except for the bottom sides 130 thereof. That is, the bottom sides 130 of the conductive bumps 13 are exposed to outside of a bottom side 140 of the encapsulant 14, and coplanarly positioned with the bottom side 140. This therefore provides good planarity for a bottom side of the fabricated product. The encapsulant 14 can be formed by using a conventional molding, printing or glob top means, with no particular restriction. Besides, the encapsulant 14 can also be formed in a two-step process. First, after completing the wire bonding process in FIG. 2D and prior to mounting the conductive bumps 13 in FIG. 2E, an inner encapsulant (not designated by a reference numeral) is formed by using a glob top or molding means for encapsulating the chip 11 and the gold wires 12. Then, as shown in FIG. 2F, an outer encapsulant is formed by using a molding, printing or glob top means for encapsulating the conductive traces 103 on the substrate 10, the conductive bumps 13 and the inner encapsulant. As such, the inner encapsulant and the outer encapsulant combine to be the encapsulant 14.

Figure 2G:
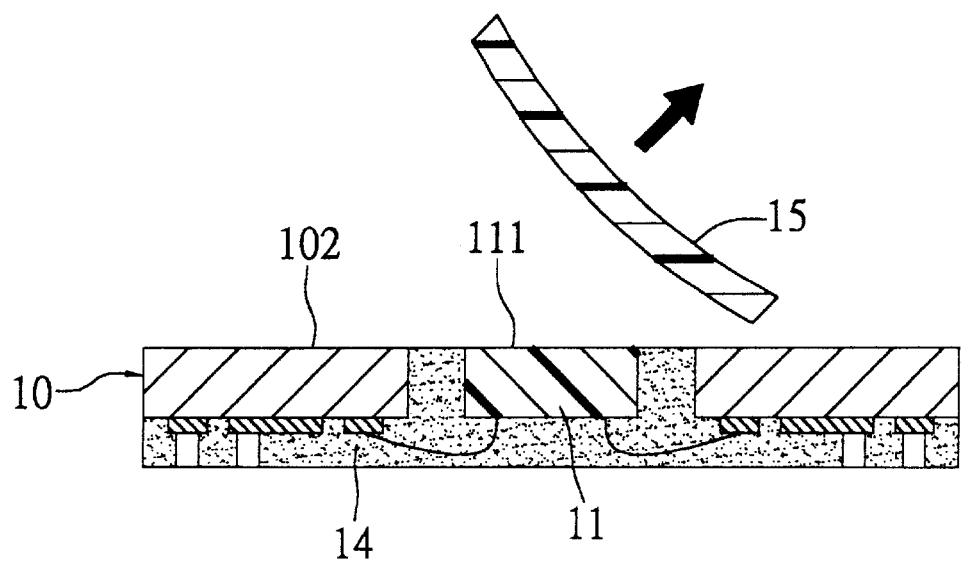

Referring finally to FIG. 2G, after the encapsulant 14 is completely formed in shape, the tape 15 is tore off from the second side 102 of the substrate 10, allowing the inactive side 111 of the chip 11 to be directly exposed to the atmosphere. This therefore allows heat generated by the chip 11 in operation to be dissipated directly through the exposed inactive side 111 to the atmosphere, thereby providing better heat dissipating efficiency for the fabricated product than the prior art. Alternatively, the tape 15 can be retained on the substrate 10; this therefore simplifies the fabrication processes, however it is disadvantageous in affecting the heat dissipating efficiency and appearance of the fabricated product.

Second Preferred Embodiment

Figure 3:
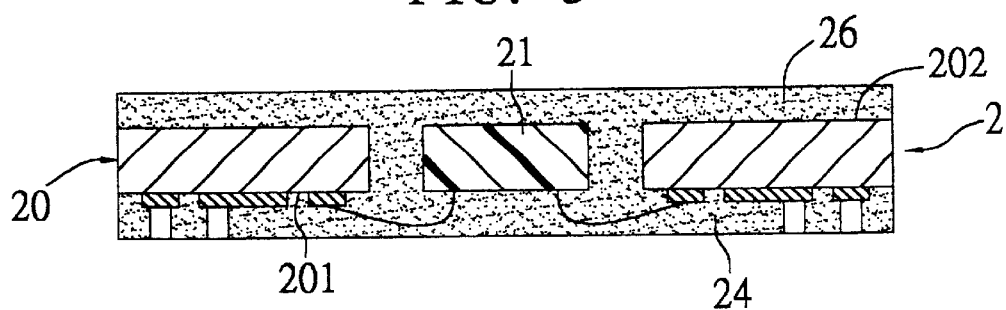
FIG. 3 is a sectional view of a semiconductor device of a second preferred embodiment of the invention.

FIG. 3 illustrates a sectional view of a semiconductor device of a second embodiment of the invention. As shown in the drawing, the semiconductor device 2 in the second embodiment is structurally identical to that in the first embodiment, with the only difference in that, in the semiconductor device 2, an upper encapsulant 26 is formed on a second side 202 of a substrate 20 and dimensioned to be approximately same in thickness as an encapsulant 24 formed under a first side 201 of the substrate 20. The upper encapsulant 26 is made of a resin compound same as that used for forming the encapsulant 24, and thus thermal stress acting on the substrate 20 and a chip 21 interposed between the encapsulants 24, 26 can be effectively reduced in a temperature cycle. This thereby prevents warpage of the substrate 20 from occurrence, and improves quality of the fabricated semiconductor device 2. Further in no concern for the occurrence of warpage, electrical connection quality between the semiconductor device 2 and external devices such as a printed circuit board can be assured. In addition, the upper encapsulant 26 provides protection for the chip 21, and thus the chip 21 can have better mechanical strength and not be damaged easily by external impact.

Third Preferred Embodiment

Figure 4:
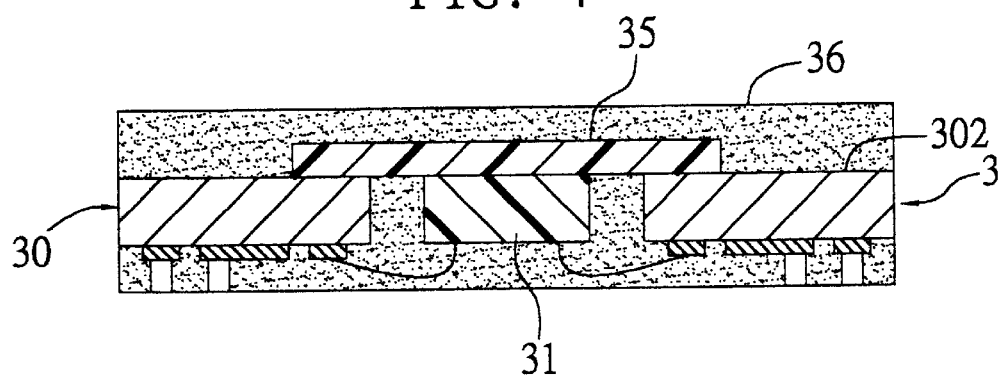
FIG. 4 is a sectional view of a semiconductor device of a third preferred embodiment of the invention.

FIG. 4 illustrates a sectional view of a semiconductor device of a third embodiment of the invention. As shown in the drawing, the semiconductor device 3 in the third embodiment is structurally identical to that in the first embodiment, with the only difference in that, in the semiconductor device 3, a tape 35 adhered to a second side 302 of a substrate 30 is used for disposing a chip 31 thereon. The tape 35 is retained on the second side 302 of the substrate 30 after an encapsulant 34 is completely formed in shape. This therefore simplifies the fabrication processes for the semiconductor device 3 in no need to tear off the tape 35 from the substrate 30. The retained tape 35 is then encapsulated by an upper encapsulant 36 formed on the second side 302 of the substrate 30.

Besides, the tape 35 can be replaced by a heat sink made of a good conductive metal, and the chip 31 can be directly mounted on the heat sink for transmitting heat generated by the chip 31 directly to the heat sink, thus improving heat dissipating efficiency of the device.

Fourth Preferred Embodiment

Figure 5:
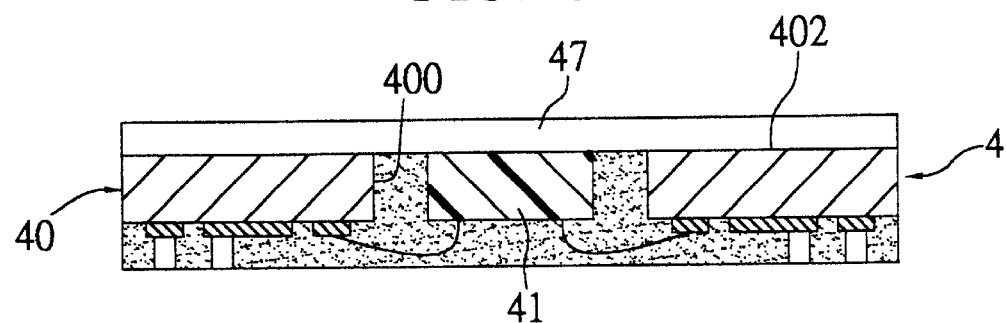
FIG. 5 is a sectional view of a semiconductor device of a fourth preferred embodiment of the invention.

FIG. 5 illustrates a sectional view of a semiconductor device of a fourth embodiment of the invention. As shown in the drawing, the semiconductor device 4 in the fourth embodiment is structurally identical to that in the first embodiment, with the only difference in that, in the semiconductor device 4, a heat sink 47 dimensionally similar in surface area to a substrate 40 is attached to a second side 402 of the substrate 40 via a conventional adhesive, allowing one end of an opening 400 on the second side 402 of the substrate 40 to be covered by the heat sink 47. Then, a chip 41 is accommodated in the opening 400 in a manner that the chip 41 is attached to the heat sink 47 through the opening 400 via an adhesive such as silver paste. Therefore, since the chip 41 is attached to the heat sink 47, and an exposed surface of the heat spreader 47 is in direct contact with the atmosphere, heat generated by the chip 41 can be directly dissipated through the heat sink 47 to the atmosphere, and thus heat dissipating efficiency of the semiconductor device 4 is improved. Further, since the heat sink 47 is similar in surface area to the substrate 40, and thus provides a larger heat dissipating area for the semiconductor device.

Fifth Preferred Embodiment

Figure 6:
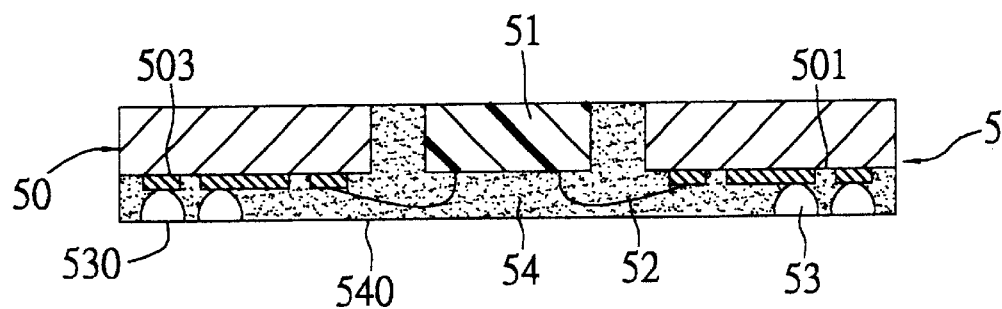
FIG. 6 is a sectional view of a semiconductor device of a fifth preferred embodiment of the invention.

FIG. 6 illustrates a sectional view of a semiconductor device of a fifth embodiment of the invention. As shown in the drawing, the semiconductor device 5 in the fifth embodiment is structurally identical to that in the first embodiment, with the only difference in that, in the semiconductor device 5, solder balls 53 are used for providing electrical connection between a chip 51 and external devices, instead of the conductive bumps used in the first embodiment. Therefore, a plurality of array-arranged solder balls 53 are implanted on a first side 501 of a substrate 50 by using a conventional ball implantation machine, in a manner that the solder balls 53 are electrically connected to corresponding conductive traces 503 on the first side 501 of the substrate 50. After completing the ball implantation, an encapsulant 54 is formed on the first side 501 of the substrate 50 to encapsulate the solder balls 53. Generally the commonly used solder balls are higher than tops 520 of wire loop formed by gold wires 52, which are used for electrically connecting the substrate 50 to the chip 51. As such, after the encapsulant 54 is completely formed in shape, a grinding process is performed to grind the encapsulant 54 and the solder balls 53 by using a conventional grinding machine (not shown), so that the thickness of the encapsulant 54 and the height of the solder balls 53 can be simultaneously reduced. The thickness of the encapsulant 54 can only be reduced to an extent as not to expose the gold wires 52, which are necessarily encapsulated in the encapsulant 54. Bottom sides 530 of the ground solder balls 53 are exposed to outside of the encapsulant 54, and coplanarly positioned with a bottom surface 540 of the encapsulant 54. This therefore provides the semiconductor device 5 with good planarity for a processing plane (i.e. the exposed plane of the solder balls 53) and with good electrical connection to external devices.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device, comprising:
    a substrate having a first side and an opposing second side, and formed with an opening penetrating the substrate, wherein a plurality of conductive traces are disposed on the first side of the substrate;
    a chip having an active side and an opposing inactive side, and accommodated in the opening of the substrate, wherein the chip is dimensionally smaller in surface area than the opening;
    a plurality of first conductive elements for connecting the active side of the chip to the conductive traces on the substrate, so as to establish electrical connection between the chip and the substrate;
    a plurality of array-arranged second conductive elements disposed on the first side of the substrate, and electrically connected to the conductive traces on the substrate; and
    a first encapsulant formed on the first side of the substrate for encapsulating the chip, the first conductive elements, the second conductive elements and the conductive traces, in a manner that the inactive side of the chip and bottom sides of the second conductive elements are exposed to outside of the first encapsulant respectively, and the bottom sides of the second conductive elements are coplanarly positioned with a bottom side of the first encapsulant beneath the first side of the substrate.

2. The semiconductor device of claim 1, wherein the first conductive elements are gold wires.

3. The semiconductor device of claim 1, wherein the first conductive elements are TAB (tape automated bonding) tapes.

4. The semiconductor device of claim 1, wherein the second conductive elements are conductive bumps.

5. The semiconductor device of claim 1, wherein the second conductive elements are solder balls.

6. The semiconductor device of claim 1, wherein a periphery of the chip is spaced from the substrate by a certain distance.

7. The semiconductor device of claim 1, wherein a second encapsulant is formed on the second side of the substrate.

8. The semiconductor device of claim 1, wherein a tape is attached to the second side of the substrate for covering one end of the opening of the substrate, and for bonding the chip via the opening to the tape.

9. The semiconductor device of claim 1, wherein a heat sink is attached to the second side of the substrate for covering one end of the opening of the substrate, and for bonding the chip via the opening to the heat sink.

10. The semiconductor device of claim 9, wherein the heat sink covers the entire second side of the substrate.

* * * * *